(12) United States Patent
Lee et al.

(10) Patent No.: US 10,808,171 B2
(45) Date of Patent: Oct. 20, 2020

(54) INFRARED EMITTING FLUORIDE PHOSPHOR AND INFRARED LIGHT EMITTING DEVICE

(71) Applicant: Lextar Electronics Corporation, Hsinchu (TW)

(72) Inventors: Chi Lee, Hsinchu (TW); Mu-Huai Fang, Hsinchu (TW); Ru-Shi Liu, Hsinchu (TW); Yi-Ting Tsai, Hsinchu (TW); Tzong-Liang Tsai, Hsinchu (TW); Yu-Chun Lee, Hsinchu (TW)

(73) Assignee: LEXTAR ELECTRONICS CORPORATION, Hsinchu (TW)

( * ) Notice: Subject to any disclaimer, the term of this patent is extended or adjusted under 35 U.S.C. 154(b) by 0 days.

(21) Appl. No.: 16/261,533

(22) Filed: Jan. 29, 2019

(65) Prior Publication Data

US 2019/0233723 A1 Aug. 1, 2019

Related U.S. Application Data

(60) Provisional application No. 62/623,611, filed on Jan. 30, 2018.

(30) Foreign Application Priority Data

Oct. 23, 2018 (CN) .......................... 2018 1 1235150

(51) Int. Cl.
| | |
|---|---|
| *C09K 11/08* | (2006.01) |
| *H01L 33/50* | (2010.01) |
| *C09K 11/00* | (2006.01) |

(52) U.S. Cl.
CPC .............. *C09K 11/08* (2013.01); *C09K 11/00* (2013.01); *H01L 33/501* (2013.01); *H01L 33/502* (2013.01); *H01L 33/504* (2013.01)

(58) Field of Classification Search
CPC ... H01L 33/501; H01L 33/502; H01L 33/504; C09K 11/08; C09K 11/00
(Continued)

(56) References Cited

U.S. PATENT DOCUMENTS

| 9,605,199 B1 * | 3/2017 | Camardello ....... C09K 11/7734 |
| 2012/0305972 A1 * | 12/2012 | Meyer .................. C09K 11/645 |
| | | 257/98 |

(Continued)

FOREIGN PATENT DOCUMENTS

| CN | 107118770 A | 9/2017 |
| CN | 107142107 A | 9/2017 |

OTHER PUBLICATIONS

Enhai Song et al., Highly Efficient and Thermally Stable K3AlF6:Mn4+ as a Red Phosphor for Ultra-High-Performance Warm White Light-Emitting Diodes, ACS Appl. Mater. Interfaces, Mar. 15, 2017, vol. 9, Issue 10, p. 8805-8812, pub 2017.

*Primary Examiner* — Dao H Nguyen
(74) *Attorney, Agent, or Firm* — CKC & Partners Co., LLC

(57) ABSTRACT

An infrared emitting fluoride phosphor and an infrared light emitting device are provided. The infrared emitting fluoride phosphor includes an activation center of $Cr^{3+}$. The infrared light emitting device includes a light source and the infrared emitting fluoride phosphor. The light source is disposed to emit a first light, and the first light has a wavelength of 400-700 nm. The infrared emitting fluoride phosphor is configured to be excited by the first light to emit a first infrared ray. The first infrared ray has a wavelength of 650-1000 nm. The infrared light emitting device has a broad emission wavelength, such that it can be applied in variety of sensing device.

18 Claims, 10 Drawing Sheets

(58) Field of Classification Search
USPC .............. 257/98, 102, 103, 613; 349/71;
252/301.36, 301.4 F, 301.6 F, 301.4 R,
252/301.4 P; 362/293, 97.3
See application file for complete search history.

(56) References Cited

U.S. PATENT DOCUMENTS

| | | | |
|---|---|---|---|
| 2016/0090528 A1 | 3/2016 | Yoshida et al. | |
| 2016/0168457 A1* | 6/2016 | Camardello | C09K 11/617 349/71 |
| 2018/0306410 A1* | 10/2018 | Abe | G02B 6/00 |
| 2019/0323664 A1* | 10/2019 | Abe | F21V 9/38 |

* cited by examiner

INFRARED EMITTING FLUORIDE PHOSPHOR AND INFRARED LIGHT EMITTING DEVICE

CROSS-REFERENCE TO RELATED APPLICATION

This application claims priority to U.S. Provisional Application Ser. No. 62/623,611 filed Jan. 30, 2018, and China Application Serial Number 201811235150.5, filed Oct. 23, 2018, the disclosures of which are incorporated herein by reference in their entireties.

BACKGROUND

Field of Invention

The present invention relates to an infrared emitting fluoride phosphor and an infrared light emitting device.

Description of Related Art

Infrared light emitting devices have been widely used in fields such as industrial safety monitoring, virtual reality devices, face recognition, iris recognition and food detection. For example, the presence and content of a specific substance in a sample can be determined by irradiating infrared rays onto the sample and then analyzing the wavelength distribution of the reflected light.

In addition, the infrared light emitting device can emit an infrared ray by utilizing a phosphor being excited by a light emitted from a light emitting diode (LED). Therefore, the development of novel infrared ray phosphor material with broadband emission spectrum is one of the important goals of the developments of infrared light emitting device.

SUMMARY

The invention provides a novel infrared emitting fluoride phosphor and an infrared light emitting device including thereof, thereby the infrared light emitting device has broad emission wavelength, which can be used in a variety of sensing devices.

According to various embodiments of the present invention, an infrared emitting fluoride phosphor including an activation center of $Cr^{3+}$ is provided.

According to various embodiments of the present invention, the infrared emitting fluoride phosphor is at least one selected from the group consisting of (A) and (B): (A) $A_3B_{1-x}F_6:xCr^{3+}$, wherein A includes Li, Na, K, Rb, Cs, $NH_4$, or a combination of thereof, B includes Al, Ga, or a combination of thereof, and $0<x\leq1$; and (B) $A_3B_{1-y-z}F_6:yCr^{3+}, zNi^{2+}$, wherein A includes Li, Na, K, Rb, Cs, $NH_4$, or a combination of thereof, B includes Al, Ga, or a combination of thereof, $0<y<1$, $0<z<1$, and $0<y+z\leq1$.

According to some embodiments of the present invention, the infrared emitting fluoride phosphor is excited by a light source of a wavelength of 400-700 nm to emit an infrared ray, and the infrared ray has an emission wavelength of 650-1000 nm.

According to some embodiments of the present invention, the first infrared ray has a spectrum having a peak emission wavelength of 735-750 nm.

According to some embodiments of the present invention, the spectrum has a full width at half maximum (FWHM) of 90-110 nm.

According to various embodiments of the present invention, an infrared light emitting device including a light source and the infrared emitting fluoride phosphor is provided. The light source is configured to emit a first light, and the first light has a wavelength of 400-700 nm. The infrared emitting fluoride phosphor includes an activation center of $Cr^{3+}$, and the infrared emitting fluoride phosphor is capable of being excited by the first light to emit a first infrared ray. The first infrared ray has an emission wavelength of 650-1000 nm.

According to some embodiments of the present invention, the infrared emitting fluoride phosphor is at least one selected from the group consisting of (A) and (B): (A) $A_3B_{1-x}F_6:xCr^{3+}$, wherein A includes Li, Na, K, Rb, Cs, $NH_4$, or a combination of thereof, B includes Al, Ga, or a combination of thereof, and $0<x\leq1$; and (B) $A_3B_{1-y-z}F_6:yCr^{3+}, zNi^{2+}$, wherein A includes Li, Na, K, Rb, Cs, $NH_4$, or a combination of thereof, B includes Al, Ga, or a combination of thereof, $0<y<1$, $0<z<1$, and $0<y+z\leq1$.

According to some embodiments of the present invention, the infrared emitting fluoride phosphor is dispersed in a packaging material, and the packaging material surrounds the light source.

According to some embodiments of the present invention, the infrared light emitting device further includes a first wavelength converting layer in contact with a surface of the light source or disposed over the light source, and the first wavelength converting layer includes the infrared emitting fluoride phosphor.

According to some embodiments of the present invention, the infrared light emitting device further includes a phosphor, a quantum dot, or a combination of thereof. The phosphor, the quantum dot, or the combination of thereof is configured to be excited by the first light to emit a second light, and the second light includes a second infrared ray and/or a visible light. The first infrared ray has a first peak emission wavelength, the second infrared ray has a second peak emission wavelength, and the first peak emission wavelength is different from the second peak emission wavelength. The visible light has a wavelength of 400-700 nm, and the infrared emitting fluoride phosphor is configured to be excited by the visible light to emit a third infrared ray. The third infrared ray has an emission wavelength of 650-1000 nm.

According to some embodiments of the present invention, the infrared emitting fluoride phosphor is blended with the phosphor, the quantum dot, or the combination of thereof in a packaging material, and the packaging material surrounds the light source.

According to some embodiments of the present invention, the infrared light emitting device further includes a first wavelength converting layer in contact with a surface of the light source or disposed over the light source. The first wavelength converting layer includes the infrared emitting fluoride phosphor and the phosphor, quantum dot, or the combination of thereof.

According to some embodiments of the present invention, the infrared light emitting device further includes a first wavelength converting layer and a second wavelength converting layer. The second wavelength converting layer is disposed between the first wavelength converting layer and the light source. The first wavelength converting layer includes the infrared emitting fluoride phosphor, and the second wavelength converting layer includes the phosphor, the quantum dot, or the combination of thereof.

According to some embodiments of the present invention, the first infrared ray has a spectrum having a peak emission wavelength of 735-750 nm.

According to some embodiments of the present invention, the spectrum has a full width at half maximum (FWHM) of 90-110 nm.

According to some embodiments of the present invention, the light source includes a LED chip.

According to various embodiments of the present invention, an infrared light emitting device including a light source, a first wavelength converting material, and an infrared emitting fluoride phosphor is provided. A light source is configured to emit a first light. A first wavelength converting material is configured to be excited by the first light to emit a second light, and the second light has a wavelength of 400-700 nm. The infrared emitting fluoride phosphor includes an activation center of $Cr^{3+}$, and the infrared emitting fluoride phosphor is configured to be excited by the second light to emit a first infrared ray. The first infrared ray has an emission wavelength of 650-1000 nm.

According to some embodiments of the present invention, the infrared light emitting device further includes a second wavelength converting material. The second wavelength converting material is configured to be excited by the first light or the second light to emit a second infrared ray. The first infrared ray has a first peak emission wavelength, the second infrared ray has a second peak emission wavelength, and the first peak emission wavelength is different from the second peak emission wavelength.

According to some embodiments of the present invention, the first wavelength converting material includes a phosphor, a quantum dot, or a combination of thereof.

According to some embodiments of the present invention, the light source includes a LED chip.

The invention provides a novel infrared emitting fluoride phosphor and an infrared light emitting device including thereof. Compared with the conventional technique, the infrared emitting fluoride phosphor of the present invention includes an activation center of $Cr^{3+}$, it can be synthesized under room temperature, and the manufacturing method is easy. The infrared emitting fluoride phosphor of the present invention has a broad emission wavelength. The infrared light emitting device including this infrared emitting fluoride phosphor can substitute for the conventional infrared light emitting device, and being applied to various fields such as food inspection device, cancer detection device, etc. In addition, the infrared light emitting device of the present invention can also be used with other infrared emitting phosphors and/or LEDs. For example, infrared light emitting device can be used with other infrared emitting phosphor to broaden the emission wavelength, or be used with green LED to monitor heartbeat.

It is to be understood that both the foregoing general description and the following detailed description are by examples, and are intended to provide further explanation of the invention as claimed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
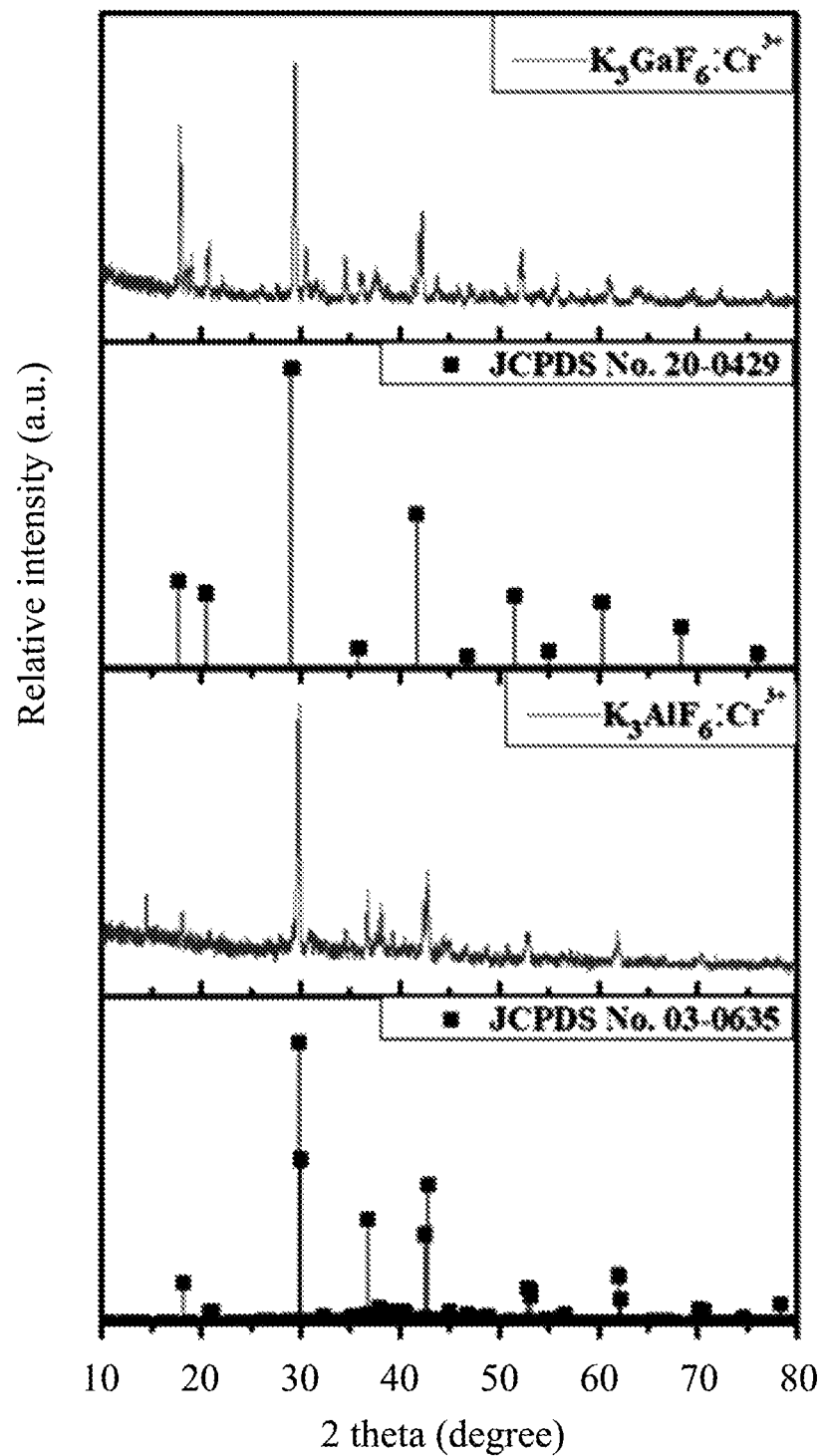
FIG. 1 is X-ray powder diffraction (XRD) patterns of infrared emitting fluoride phosphors according to some embodiments of the present invention.

The following embodiments are disclosed with accompanying diagrams for detailed description. For illustration clarity, many details of practice are explained in the following descriptions. However, it should be understood that these details of practice do not intend to limit the present invention. That is, these details of practice are not necessary in parts of embodiments of the present invention. Furthermore, for simplifying the drawings, some of the conventional structures and elements are shown with schematic illustrations.

The relative terms, such as "lower" or "bottom" and "upper" or "top", may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper", depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

An aspect of the present invention is to provide an infrared emitting fluoride phosphor. In various embodiments, the infrared emitting fluoride phosphor may include an activation center of $Cr^{3+}$. In some embodiments, the infrared emitting fluoride phosphor is at least one selected from the group consisting of (A) and (B): (A) $A_3B_{1-x}F_6$:$xCr^{3+}$, wherein A includes Li, Na, K, Rb, Cs, $NH_4$, or a combination of thereof, B includes Al, Ga, or a combination of thereof, and $0<x\leq1$; and (B) $A_3B_{1-y-z}F_6$:$yCr^{3+}$, $zNi^{2+}$, wherein A includes Li, Na, K, Rb, Cs, $NH_4$, or a combination of thereof, B includes Al, Ga, or a combination of thereof, $0<y<1$, $0<z<1$, and $0<y+z\leq1$.

The infrared emitting fluoride phosphor with the formula $A_3B_{1-x}F_6$:$xCr^{3+}$ has a single activation center of $Cr^{3+}$, and illustrative examples may include $Li_3Al_{1-x}F_6$:$Cr^{3+}$, $Li_3Ga_{1-x}F_6$:$xCr^{3+}$, $Na_3Al_{1-x}F_6$:$xCr^{3+}$, $Na_3Ga_{1-x}F_6$:$xCr^{3+}$, $K_3Al_{1-x}F_6$:$xCr^{3+}$, $K_3Ga_{1-x}F_6$:$xCr^{3+}$, $Rb_3Al_{1-x}F_6$:$xCr^{3+}$, $Rb_3Ga_{1-x}F_6$:$xCr^{3+}$, $Cs_3Al_{1-x}F_6$:$xCr^{3+}$, $Cs_3Ga_{1-x}F_6$:$xCr^{3+}$, $(NH_4)_3Al_{1-x}F_6$:$xCr^{3+}$, or $(NH_4)_3Ga_{1-x}F_6$:$xCr^{3+}$, in which x may be 0.1, 0.2, 0.3, 0.4, 0.5, 0.6, 0.7, 0.8, or 0.9. The infrared emitting fluoride phosphor with the formula $A_3B_{1-y-z}F_6$:$yCr^{3+}$, $zNi^{2+}$ has two kinds of activation centers, i.e., $Cr^{3+}$ and $Ni^{2+}$, and illustrative examples may include $Li_3Al_{1-y-z}F_6$:$yCr^{3+}$, $zNi^{2+}$, $Li_3Ga_{1-y-z}F_6$:$yCr^{3+}$, $zNi^{2+}$, $Na_3Al_{1-y-z}F_6$:$yCr^{3+}$, $zNi^{2+}$, $Na_3Ga_{1-y-z}F_6$:$yCr^{3+}$, $zNi^{2+}$, $K_3Al_{1-y-z}F_6$:$yCr^{3+}$, $zNi^{2+}$, $K_3Ga_{1-y-z}F_6$:$yCr^{3+}$, $zNi^{2+}$, $Rb_3Al_{1-y-z}F_6$:$yCr^{3+}$, $zNi^{2+}$, $Rb_3Ga_{1-y-z}F_6$:$yCr^{3+}$, $zNi^{2+}$, $Cs_3Al_{1-y-z}F_6$:$yCr^{3+}$, $zNi^{2+}$, $Cs_3Ga_{1-y-z}F_6$:$yCr^{3+}$, $zNi^{2+}$, $(NH_4)_3Al_{1-y-z}F_6$:$yCr^{3+}$, $zNi^{2+}$, or $(NH_4)_3Ga_{1-y-z}F_6{:}yCr^{3+}, zNi^{2+}$, in which y may be 0.1, 0.2, 0.3, 0.4, 0.5, 0.6, 0.7, 0.8, or 0.9, z may be 0.1, 0.2, 0.3, 0.4, 0.5, 0.6, 0.7, 0.8, or 0.9, and $0<y+z\leq 1$. Compared to the infrared emitting fluoride phosphor with single activation center, the infrared emitting fluoride phosphor with two kinds of activation centers may have a broader emission wavelength range. In some embodiments, the infrared emitting fluoride phosphor is excited by a light source of a wavelength of 400-700 nm so as to emit an infrared ray having an emission wavelength of 650-1000 nm. In some embodiments, the infrared ray emitted by the infrared emitting fluoride phosphor has a spectrum with a peak emission wavelength of 735-750 nm. In some embodiments, the emission spectrum has a full width at half maximum (FWHM) of 90-110 nm.

According to one embodiment of the present invention, a method of preparing the infrared emitting fluoride phosphor is provided. The infrared emitting fluoride phosphor was prepared by the method described below. First, a host lattice precursor $K_3GaF_6$ of the infrared emitting fluoride phosphor was synthesized. In specifics, 0.4000 g of $Ga(NO_3)_3 \cdot 8H_2O$ and 4.5 ml deionized water were added to a 50 ml plastic centrifugal tube, and stirred at room temperature for 10 minutes. 2.3247 g of KF was added in the plastic centrifugal tube containing the $Ga(NO_3)_3$ solution and was then stirred for 30 minutes, followed by standing for 24 hours, and then the mixture in the plastic centrifugal tube was centrifuged. The precipitate was treated with deionized water and alcohol, and was placed in an oven to be dried in a 70° C. atmosphere for 5 hours.

Next, an activator precursor $K_3CrF_6$ of the infrared emitting fluoride phosphor was synthesized. In specifics, 0.4000 g of $Cr(NO_3)_3 \cdot 9H_2O$ and 4.5 ml deionized water were added into a 50 ml plastic centrifuge tube and stirred at room temperature for 10 minutes. 4.0654 g of KF was then added to the plastic centrifugal tube and mixture was stirred for 30 minutes, followed by standing for 24 hours, and then centrifugation was carried out. The precipitate was treated with deionized water and alcohol, and was placed in an oven to be dried in a 70° C. atmosphere for 5 hours.

Next, 0.4000 g of the host lattice precursor $K_3GaF_6$ of the infrared emitting fluoride phosphor and 0.0376 g activator precursor $K_3CrF_6$ of the infrared emitting fluoride phosphor were placed in a 15 ml plastic centrifuge tube, and the powder was uniformly mixed by a vertex mixer. Next, 1.0 ml HF (48%) was added in the plastic centrifuge tube, and was mixed using an ultrasonicator to form a homogeneous solution. Finally, the solution was transferred to a plastic box and placed in an oven, and dried at 70° C. for 24 hours to obtain infrared emitting fluoride phosphor $KGaF_6{:}Cr^{3+}$.

According to one embodiment of the present invention, a method of preparing the infrared emitting fluoride phosphor $K_3AlF_6{:}Cr^{3+}$ is provided. The infrared emitting fluoride phosphor was prepared by the method described below. First, a host lattice precursor $K_3AlF_6$ of the infrared emitting fluoride phosphor was synthesized. In specifics, 0.3751 g of $Al(NO_3)_3 \cdot 9H_2O$ and 4.5 ml deionized water were added to a 50 ml plastic centrifugal tube, and stirred at room temperature for 10 minutes. 0.9877 g of KF was added in the plastic centrifugal tube containing the $Al(NO_3)_3$ solution and was then stirred for 30 minutes, followed by standing for 24 hours, and then the mixture in the plastic centrifugal tube was centrifuged. The precipitate was treated with deionized water and alcohol, and was placed in an oven to be dried in a 70° C. atmosphere for 5 hours.

Next, an activator precursor $K_3CrF_6$ of the infrared emitting fluoride phosphor was synthesized. In specifics, 0.4000 g of $Cr(NO_3)_3 \cdot 9H_2O$ and 4.5 ml deionized water to a 50 ml plastic centrifuge tube and stirred at room temperature for 10 minutes. 4.0654 g of KF was then added to the plastic centrifugal tube and mixture was stirred for 30 minutes, followed by standing for 24 hours, and then centrifugation was carried out. The precipitate was treated with deionized water and alcohol, and is placed in an oven to be dried in a 70° C. atmosphere for 5 hours.

Next, 0.5000 g of the host lattice precursor $K_3AlF_6$ of the infrared emitting fluoride phosphor and 0.0538 g activator precursor $K_3CrF_6$ of the infrared emitting fluoride phosphor were placed in a 15 ml plastic centrifuge tube, and the powder was uniformly mixed by a vertex mixer. Next, 1.0 ml HF (48%) was added in the plastic centrifuge tube, and was mixed using an ultrasonicator to form a homogeneous solution. Finally, the solution was transferred to a plastic box and placed in an oven, and dried at 70° C. for 24 hours to obtain infrared emitting fluoride phosphor $KAlF_6{:}Cr^{3+}$.

FIG. 1 is an x-ray powder diffraction (XRD) pattern of an infrared emitting fluoride phosphor $K_3GaF_6{:}Cr^{3+}$ and $K_3AlF_6{:}Cr^{3+}$ in accordance the above embodiment. As shown in FIG. 1, the infrared emitting fluoride phosphor $K_3GaF_6{:}Cr^{3+}$ and $K_3AlF_6{:}Cr^{3+}$ of the present invention are respectively compared with the standard JCPDS patterns of $K_3GaF_6$ and $K_3AlF_{6+}$ which are known as cubic structure, the peak positions of all infrared emitting fluoride phosphors are consistent with the standard JCPDS patterns. That is, the infrared emitting fluoride phosphors $K_3GaF_6{:}Cr^{3+}$ and $K_3AlF_6{:}Cr^{3+}$ are cube structures.

Figure 2:
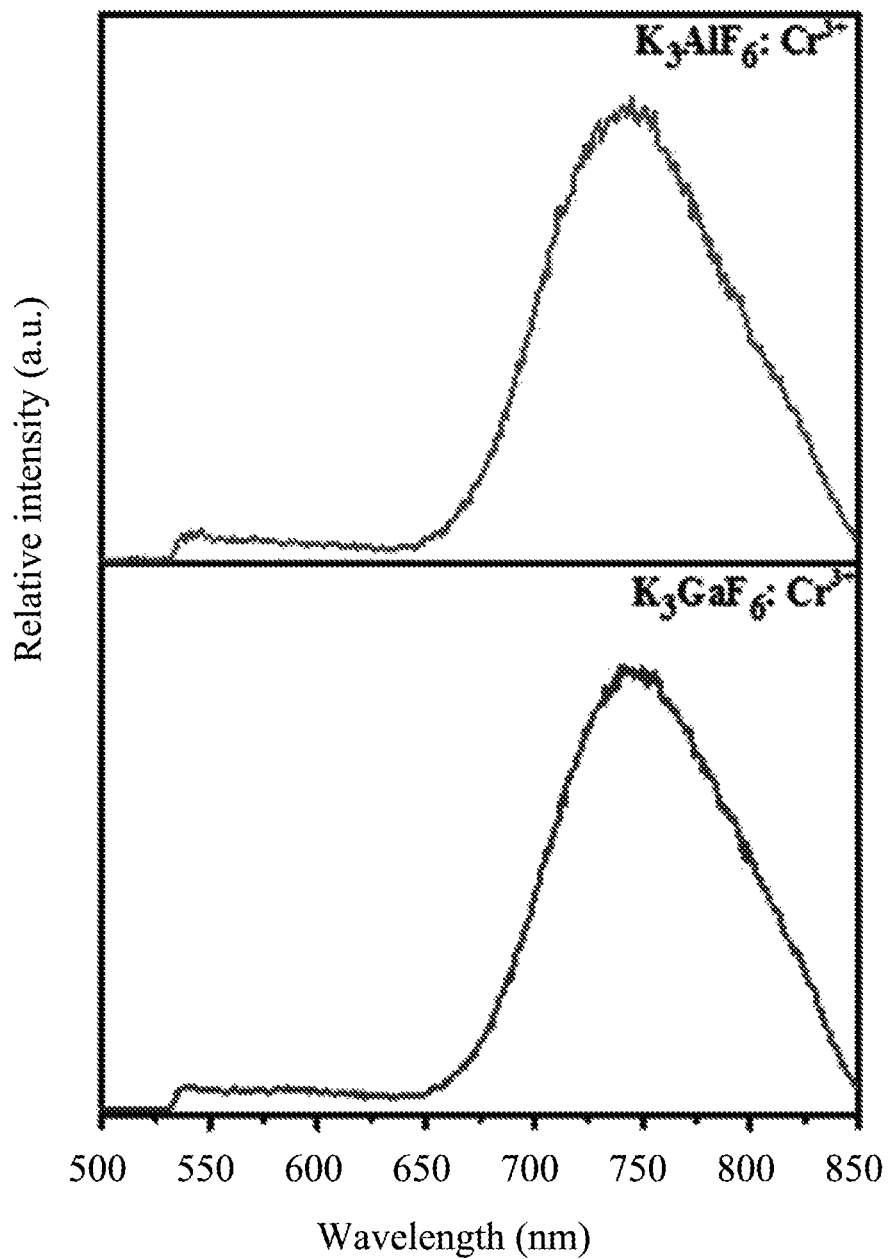
FIG. 2 is a photoluminescence (PL) spectrum of infrared emitting fluoride phosphor according to some embodiments of the present invention.

FIG. 2 is a fluorescence emission spectrum of the infrared emitting fluoride phosphor in accordance with some embodiments of the present invention, the infrared emitting fluoride phosphor is excited by a light source with a wavelength of 450 nm. As shown in FIG. 2, the infrared emitting fluoride phosphor $K_3GaF_6{:}Cr^{3+}$ has a spectrum having a peak emission wavelength of about 740 nm, and the spectrum has a full width at half maximum (FWHM) of about 106 nm. The infrared emitting fluoride phosphor $K_3AlF_6{:}Cr^{3+}$ has a spectrum having a peak emission wavelength of about 745 nm, and the spectrum has a full width at half maximum (FWHM) of about 100 nm.

An aspect of the present invention is to provide an infrared light emitting device. FIGS. 3-17 are cross-sectional views of an infrared light emitting device in accordance with various embodiments of the present invention. In various embodiments, the infrared light emitting device includes a light source, and the aforementioned infrared emitting fluoride phosphors. In some embodiments, the light source includes a LED chip. In some examples, the LED chip may be disposed in a flip-chip type manner or in a face-up type manner. In some embodiments, the infrared emitting fluoride phosphor may be in direct contact with the light source or spaced from the light source by a distance. In some examples, the infrared emitting fluoride phosphor forms a film structure, which may be in contact with a surface of the light source or be disposed above the light source. In some examples, the infrared emitting fluoride phosphor is dispersed in a packaging material, and the packaging material surrounds the light source. In the following description, various types of the infrared light emitting device will be described, and the materials of the infrared emitting fluoride phosphor described above will not be repeated hereafter.

Figure 3:
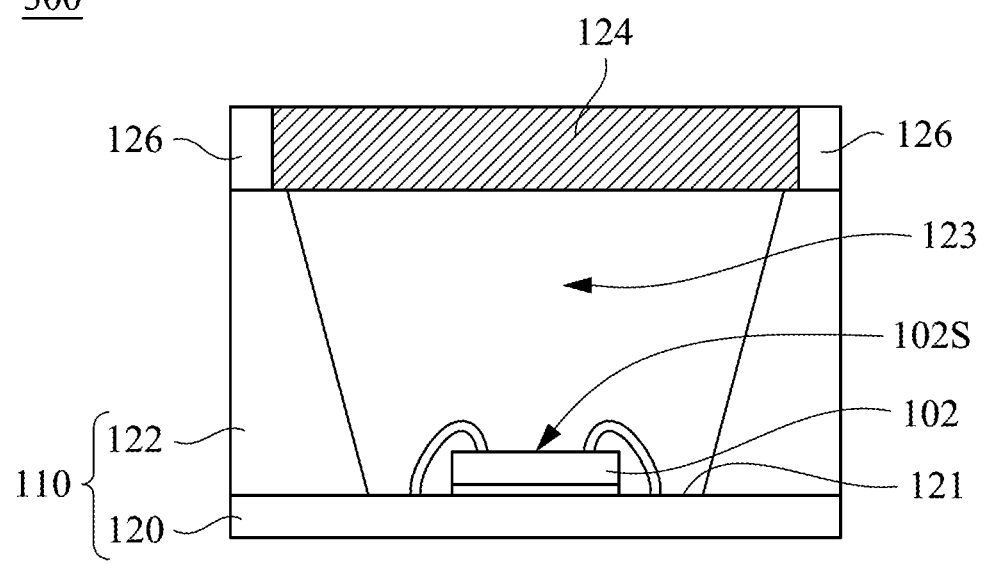
FIG. 3 to FIG. 17 are cross-sectional views of infrared light emitting devices according to various embodiments of the present invention.

Please refer to FIG. 3. The infrared light emitting device 300 includes LED chip 102 and wavelength converting layer 124. The wavelength converting layer 124 may be a film structure, and includes the infrared emitting fluoride phosphor. In some embodiments, the LED chip 102 may be, but is not limited to blue LED chip, red LED chip, or green LED chip. The LED chip 102 may be configured to emit a first light, and the first light has a wavelength of 400-700 nm. The infrared emitting fluoride phosphor is capable of being excited by the first light to emit a first infrared ray, and the first infrared ray has an emission wavelength of 650-1000 nm. In some embodiments, the first infrared ray has a spectrum with a peak emission wavelength of 735-750 nm. In some embodiments, the spectrum has a full width at half maximum (FWHM) of 90-110 nm.

In some embodiments, the wavelength converting layer 124 further includes packaging material, and the infrared emitting fluoride phosphor is dispersed in the packaging material. The packaging material may be, for example, light transmissive material, and the infrared emitting fluoride phosphor is dispersed in the light transmissive material. In some examples, the light transmissive material includes transparent gel such as epoxy, silicone, polyethylene terephthalate (PET), polypropylene (PP), polystyrene (PS), polyamide (PA), polycarbonate (PC), polyimide (PI), polymethyl methacrylate (PMMA), polydimethylsiloxane (PDMS), or the combination thereof. In other embodiments, the light transmissive material includes, but not limited to glass materials or ceramic materials, and the infrared emitting fluoride phosphor may be mixed with the glass materials or ceramic materials to form a glass phosphor film or a ceramic phosphor film.

As shown in FIG. 3, the infrared light emitting device 300 further includes substrate 110 and reflective wall 126. The substrate 110 has a base 120 and a wall 122. The base 120 has a die bonding region 121. The wall 122 is on the base 120 surrounding the die bonding region 121 and defining an accommodating space 123. The LED chip 102 is disposed in the accommodating space 123, and may be attached on the die bonding region 121 of the base 120 through an adhesive. The wavelength converting layer 124 is on the LED chip 102. More specifically, the wavelength converting layer 124 is over the accommodating space 123 corresponding to a light emitting surface 102s of the LED chip 102. In some embodiments, the wavelength converting layer 124 may disposed on a top surface of the wall 122. The reflective wall 126 may be disposed to surround an outer side wall of the wavelength converting layer 124 and on the top surface of the wall 122. In some embodiments, the reflective wall 126 may be a material having a characteristic of light-reflective and a low light leakage, such as a reflective glass, a quartz, a polymer plastic material, a light-reflection attaching sheet or other suitable materials. The polymer plastic material may include polystyrene (PS), polypropylene (PP), polyamide (PA), polycarbonate (PC), polymethyl methacrylate (PMMA), polyethylene terephthalate (PET), epoxy, silicone, or a combination thereof. The light reflectivity of the reflective wall 126 may be adjusted by adding other filler particle. In some embodiments, the filler particle may be a composite material having different particle diameters or different materials. In some examples, the material of the filler particle may be, but is not limited to $SiO_2$, $TiO_2$, $Al_2O_3$, BN, or ZnO. This concept may be applied for other embodiments, and will not be repeated hereinafter.

It is understood that the material of the components described above will not be repeated hereinafter. In the following description, other infrared light emitting device will be described.

Figure 4:
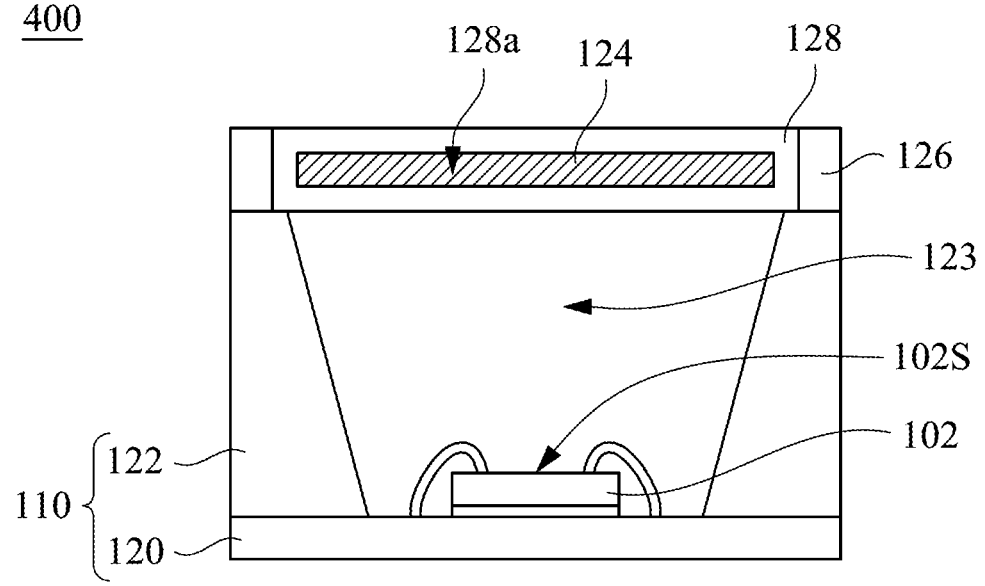

Reference is made to FIG. 4. The difference between the infrared light emitting device 400 and the infrared light emitting device 300 shown in FIG. 3 is that the infrared light emitting device 400 further includes structural element 128. The structural element 128 can supports, packages or protects the wavelength converting layer 124. As shown in FIG. 4, the structural element 128 has an accommodating region 128a for accommodating the wavelength converting layer 124 therein, and the structural element 128 covers an upper surface and a lower surface of the wavelength converting layer 124. The structural element 128 is disposed the top surface of the wall 122 so as to support the wavelength converting layer 124 to be above the accommodating space 123 corresponding to the light emitting surface 102S of the LED chip 102. In some embodiments, the structural element 128 may be formed by a transparent material or a light transmissive material so as to avoid blocking light emitting from the wavelength converting layer 124. In other embodiments, the structural element 128 may have a characteristic as a packaging material. For example, the structural element 128 may include quartz, glass, or polymer plastic material. The structural element 128 may be used for protecting the wavelength converting layer 124 from a foreign substance which would disadvantageously affect a property of the wavelength converting layer 124, such as moisture, oxygen gas, or the like. In some embodiments, the structural element 128 may be a barrier film and/or a silicon titanium oxide disposed on a surface of the wavelength converting layer 124 to avoid the foreign substances such as moisture, oxygen gas, or the like. In some examples, the silicon titanium oxide may be glass material such as $SiTiO_4$, which has a light transmissive characteristic and an antioxidative property, and may be disposed on the surface of the wavelength converting layer 124 by coating method or sticking method. In some examples, the material of the barrier film may include inorganic material, such as metal oxide (such as $SiO_2$, $Al_2O_3$, etc.), or metal nitride (such as $Si_3N_3$, etc.). The barrier film may be multi-layer barrier film disposed on the surface of the wavelength converting layer 124 by coating method or sticking method. This concept may be applied for other embodiments, and will not be repeated hereinafter. The reflective wall 126 may be disposed to surround an outer side wall of the structural element 128 and on the top surface of the wall 122.

Figure 5:
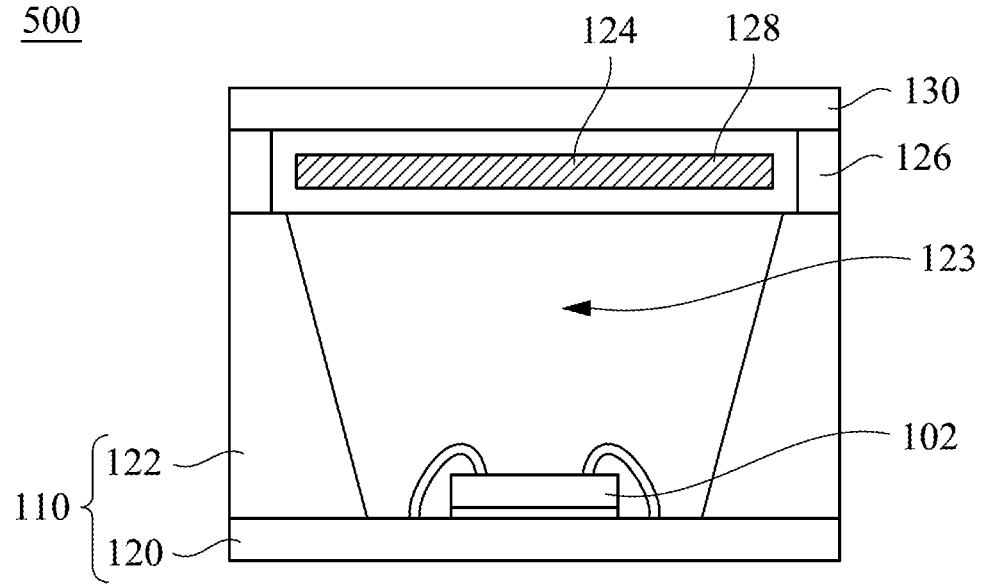

Please refer to FIG. 5. The difference between the infrared light emitting device 500 and the infrared light emitting device 400 shown in FIG. 4 is that the infrared light emitting device 500 further includes an optical layer 130 disposed on the reflective wall 126 and the structural element 128. The optical layer 130 may be used for adjusting a path of an emitting light. In some embodiments, the optical layer 130 may be transparent gel including diffusing particle. The transparent gel includes polystyrene (PS), polypropylene (PP), polycarbonate (PC), polyamide (PA), polymethyl methacrylate (PMMA), polyethylene terephthalate (PET), polyimide (PI), polydimethylsiloxane (PDMS), epoxy, silicone, or a combination thereof. In some examples, the diffusing particle may include, but is not limited to $SiO_2$, $TiO_2$, $Al_2O_3$, BN, or ZnO. In some examples, the diffusing particle may have uniform or various diameters. This concept may be applied for other embodiments, and will not be repeated hereinafter. For example, the optical layer 130 may be disposed on the wavelength converting layer 124 of the infrared light emitting devices 300, 600 and 1000 shown in FIGS. 3, 6, and 10 for adjusting a path of an emitting light.

Figure 6:
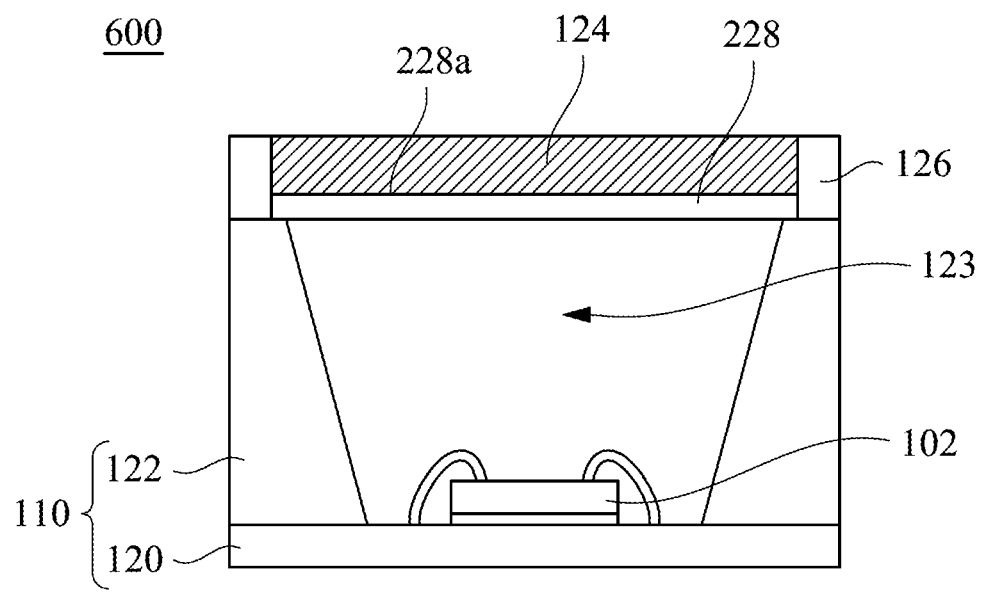

Please refer to FIG. 6. The difference between the infrared light emitting device 600 and the infrared light emitting device 300 shown in FIG. 3 is that the infrared light emitting device 600 further includes a structural element 228. The structural element 228 has an accommodating region 228a for accommodating and supporting the wavelength converting layer 124, such that the wavelength converting layer 124 may be disposed on the wall 122. The structural element 228 may be a transparent material or a light transmissive material so as to avoid blocking light emitting from the wavelength converting layer 124. In some examples, the structural element 228 may be quartz, glass, polymer plastic material, or other suitable materials. This concept may be applied for other embodiments, and will not be repeated hereinafter.

In some embodiments, the infrared emitting fluoride phosphor is capable of being excited by a first light to emit a first infrared ray, which has an emission wavelength of 650-1000 nm and a spectrum with a peak emission wavelength of 735-750 nm. In some embodiments, the wavelength converting layer 124 of the infrared light emitting device 300 shown in FIG. 3 includes the infrared emitting fluoride phosphor described above and one or more wavelength converting materials such as phosphor, quantum dot, or a combination thereof. The concept may be applied to the wavelength converting layer 124 of the infrared light emitting devices shown in FIGS. 4-6. In addition, the phosphor, quantum dot, or a combination thereof is configured to be excited by the first light to emit a second light. The second light includes a second infrared ray and/or a visible light. The second infrared ray has a second peak emission wavelength different from the first peak emission wavelength. The visible light has a wavelength of 400-700 nm. The infrared emitting fluoride phosphor may be excited by the visible light to emit a third infrared ray, and the third infrared ray has an emission wavelength of 650-1000 nm. The phosphor may be, for example, organic phosphor material of inorganic phosphor material. The organic phosphor material may include a single molecule structure, a polymolecule structure, an oligomer, or a polymer. The organic phosphor material may be selected from the group consisting of a compound with naphthaleneperylene group, a compound with anthracene group a compound with phenanthrene group, a compound with perylene group, a compound with benzimidazole gruop, a compound with fluorine group, a compound with 9-fluorenone gruop, a compound with carbazole group, a compound with glutarimide group, a compound with 1,3-diphenylbenzene group, a compound with benzopyrene group, a compound with pyrene group, a compound with pyridine group, a compound with thiophene group, a compound with 2,3-dihydro-1H-benzo[de]isoquinoline-1,3-dione group, a compound with benzimidazole group, and a combination thereof. The inorganic phosphor material may include an aluminate phosphor (such as LuYAG, GaYAG, YAG, etc.), β-SiAlON, a silicate phosphor, a nitride phosphor, a sulfide phosphor, a fluoride phosphor, etc. For example, the red phosphor powder may be fluoride phosphor $A_2[MF_6]:Mn^{4+}$, wherein A is selected from the group consisting of Li, Na, K, Rb, Cs, $NH_4$, and a combination thereof, M is selected from the group consisting of Ge, Si, Sn, Ti, Zr and a combination thereof. Optionally, the red phosphor may include (Sr,Ca)S:Eu, $CaAlSiN_3$:Eu, $(Sr, Ba)_3SiO_5$:Eu, $(Ca,Sr)_2Si_5N_8$:Eu, or $SrLiAl_3N_4$:Eu. The green phosphor may include β-SiAlON, or LuAG. The yellow phosphor material may include YAG:Ce, and/or inorganic yellow phosphor including a component of oxynitride, silicate, or nitride, and/or an organic yellow phosphor. The quantum dot material has a chemical formula such as CdSe/ZnS, CdSe/CdS, $CsPb(Cl,Br)_3$, $CsPb(Br,I)_3$, $CsPbI_3$, InP, and the like. Other wavelength converting material emitting infrared ray includes quantum dot material PbS, PbSe, nitride having an activation center of $Cr^{3+}$, oxide having an activation center of $Cr^{3+}$. The quantum dot material PbS, PbSe has an emission wavelength of 2000 nm. The nitride having an activation center of $Cr^{3+}$ has an emission wavelength of 700-1000 nm. The oxide having an activation center of $Cr^{3+}$ such as $(Ca, Sr, Ba)Ga_{12}O_{19}$: $Cr^{3+}$, $(Ca, Sr, Ba)_3Ga_2Ge_4O_{14}$: $Cr^{3+}$, $LaGaGe_2O_7$: $Cr^{3+}$, $La_3GaGe_5O_{16}$:$Cr^{3+}$ has an emission wavelength of 800-1200 nm.

The emission wavelength range of the infrared light emitting device 300 may be broaden by adding at least one other wavelength converting material emitting infrared ray such as nitride phosphor, oxide phosphor, fluoride phosphor, sulfide phosphor, silicate phosphor, quantum dots PbS, PbSe, or the like, to the wavelength converting layer 124 having the infrared emitting fluoride phosphor. Thereby, the measurement range, the measurement stability and accuracy can be increased when the infrared light emitting device 300 is applied in the detecting devices.

In the infrared light emitting devices 300 to 600, the LED chip 102 and the wavelength converting layer 124 is separated by the accommodating space 123 defined by the wall 122. Therefore, the damage of the heat stability and the chemical stability caused by the wavelength converting layer 124 close to the LED chip 102 can be prevented. Thus, the lifespan of the wavelength converting layer 124 can be prolonged and the reliability of the infrared light emitting device can be increased. The accommodating space 123 may be empty space, or may be filled with transparent packaging material (not shown). In some examples, transparent packaging material may be polystyrene (PS), polypropylene (PP), polycarbonate (PC), polyimide (PI), polyamide (PA), polymethyl methacrylate (PMMA), polyethylene terephthalate (PET), polydimethylsiloxane (PDMS), epoxy, silicone, or a combination thereof. In some embodiments, the transparent packaging material may be doped with one or more wavelength converting materials such as phosphor, quantum dot, or a combination thereof. In other embodiments, one or more wavelength converting materials may be coated on light emitting surface 102S of the LED chip 102. Therefore, in addition to the wavelength converting layer 124, the luminescence property of the infrared light emitting device can be adjusted through the transparent packaging material containing the wavelength converting material and/or the coating containing wavelength converting material on the surface of the LED chip 102. For example, the wavelength converting layer 124 containing the infrared emitting fluoride phosphor can be excited by the first light to emit a first infrared ray. The phosphor, the quantum dot, or the combination thereof blended with the transparent packaging material, or the coating of the phosphor, the quantum dot, or the combination thereof on the surface of the LED chip 102 is configured to be excited by the first light to emit a second light. The second light includes a second infrared ray and/or a visible light. The second infrared ray has a second peak emission wavelength different from the first peak emission wavelength. The visible light has a wavelength of 400-700 nm. The infrared emitting fluoride phosphor may be excited by the visible light to emit a third infrared ray, and the third infrared ray has an emission wavelength of 650-1000 nm. The type of the wavelength converting material of the wavelength converting layer 124, the packaging material and/or the coating may be appropriately adjusted according to the actual needs of the product. This concept may be applied for other embodiments, and will not be repeated hereinafter.

Figure 7:
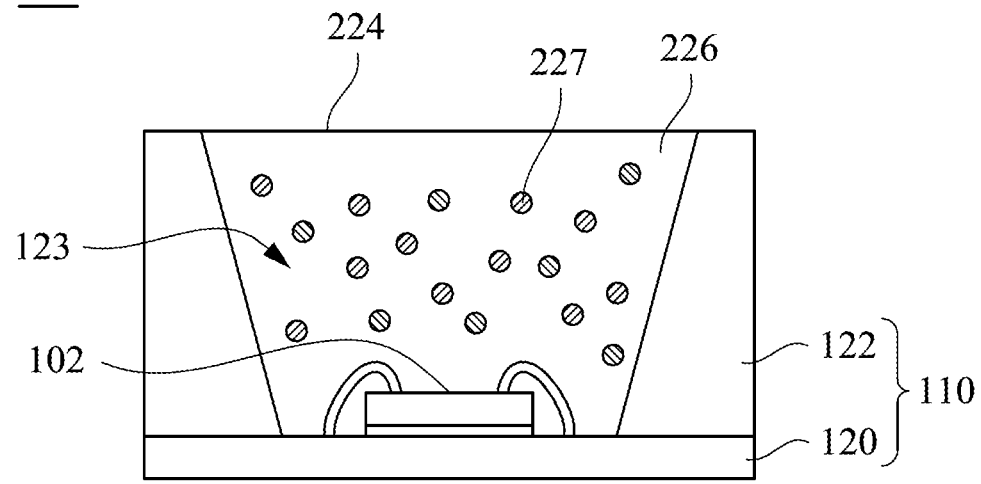

Please refer to FIG. 7. The difference between the infrared light emitting device 700 and the infrared light emitting device 300 shown in FIG. 3 is that the infrared light emitting device 700 omits the wavelength converting layer 124 and the reflective wall 126 shown in FIG. 3, and has a wavelength converting layer 224 filled in the accommodating space 123. The wavelength converting layer 224 may surround and cover the LED chip 102, and may further cover the base 120. The wavelength converting layer 224 includes the infrared emitting fluoride phosphor 227 described above. The LED chip 102 may be configured to emit a first light, and the first light has a wavelength of 400-700 nm. The infrared emitting fluoride phosphor 227 is excited by the first light to emit a first infrared ray, and the first infrared ray has an emission wavelength of 650-1000 nm. In some embodiments, the first infrared ray has a spectrum having a peak emission wavelength of 735-750 nm. In some embodiments, the spectrum has a full width at half maximum (FWHM) of 90-110 nm. In some embodiments, the wavelength converting layer 224 further includes a packaging material surrounding the LED chip 102, and the infrared emitting fluoride phosphor is dispersed in the packaging material. In some examples, the packaging material may be transparent gel such as polystyrene (PS), polypropylene (PP), polycarbonate (PC), polyimide (PI), polyamide (PA), polymethyl methacrylate (PMMA), polyethylene terephthalate (PET), polydimethylsiloxane (PDMS), epoxy, silicone, or a combination thereof.

In some embodiments, the wavelength converting layer 224 further includes one or more wavelength converting material such as phosphor, quantum dot, or a combination thereof. More specifically, in some embodiments, the infrared emitting fluoride phosphor may be blended with the phosphor, the quantum dot, or the combination thereof in the packaging material 226 (such as transparent gel). The phosphor, the quantum dot, or the combination thereof is configured to be excited by the first light to emit a second light, and the second light includes a second infrared ray and/or a visible light. In some examples, the first infrared ray has a first peak emission wavelength, the second infrared ray has a second peak emission wavelength, and the first peak emission wavelength is different from the second peak emission wavelength. The emission wavelength range of the infrared light emitting device 700 may be broaden by adding at least one wavelength converting material emitting infrared ray such as the above oxide phosphor having an activation center of $Cr^{3+}$, the nitride phosphor having an activation center of $Cr^{3+}$, the silicate phosphor, the sulfide phosphor, the quantum dots PbS, PbSe, or the like, to the wavelength converting layer 224 having the infrared emitting fluoride phosphor of this invention. In other embodiments, the visible light has a emission wavelength of 400-700 nm, and the infrared emitting fluoride phosphor may be excited by this visible light to emit a third infrared ray. The third infrared ray has an emission wavelength of 650-1000 nm.

Figure 8:
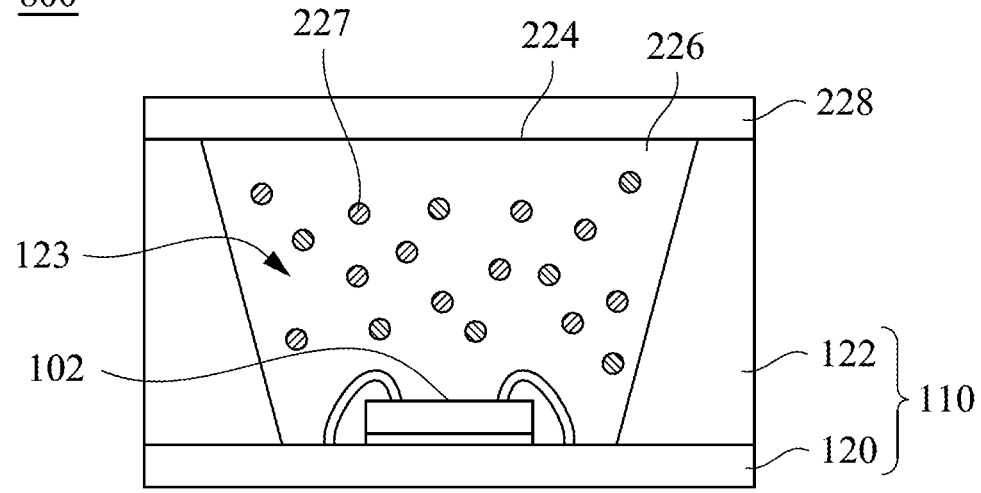

Please refer to FIG. 8. The difference between the infrared light emitting device 800 and the infrared light emitting device 700 shown in FIG. 7 is that the infrared light emitting device 800 further includes a structural element 228. The structural element 228 across the wavelength converting layer 224 to be disposed on the wall 122. The structural element 228 may be used for protecting the infrared emitting fluoride phosphor and the other wavelength-converting material of the wavelength converting layer 224 from a foreign substance that would cause a damage effect, such as moisture, oxygen gas, etc. In some embodiments, the structural element 228 may be a barrier film and/or a silicon titanium oxide disposed on a surface of the wavelength converting layer 224 to avoid the foreign substances such as moisture, oxygen gas, or the like. In some examples, the silicon titanium oxide may be, but is not limited to glass material such as $SiTiO_4$, which has a light transmissive characteristic and an antioxidative property, and may be disposed on the surface of the wavelength converting layer 224 by coating method or sticking method. In some examples, the material of the barrier film may include inorganic material, such as metal oxide (such as $SiO_2$, $Al_2O_3$, etc.), or metal nitride (such as $Si_3N_3$, etc.). The barrier film may be multi-layer barrier film disposed on the surface of the wavelength converting layer 124 by coating method or sticking method.

Figure 9:
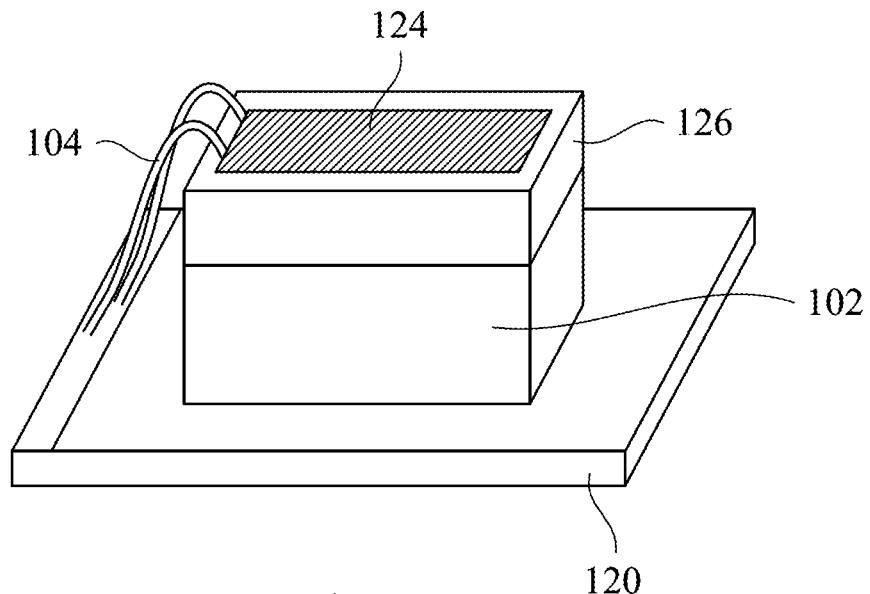

Please refer to FIG. 9. The infrared light emitting device 900 includes a base 120, a LED chip 102, a wavelength converting layer 124 and a reflective wall 126. The materials of the components in the infrared light emitting device 900 may be the same as the components having same reference numbers of the aforementioned infrared light emitting device. In the following description, the relationship between the components will be described. The LED chip 102 is disposed on the die bonding region of the base 120. The wavelength converting layer 124 is disposed on a light emitting surface of the LED chip 102. The reflective wall 126 is disposed on a side wall of the wavelength converting layer 124. In some embodiments, the LED chip 102 may be electrically connected to the base 120 by a wire 104 passing through an opening (not shown) of the wavelength converting layer 124.

Figure 10:
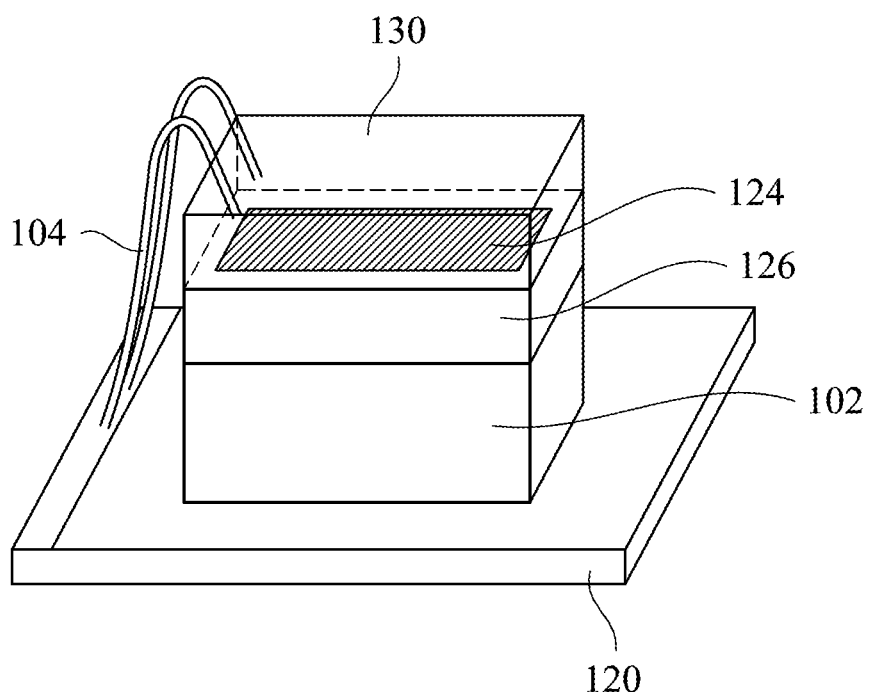

Please refer to FIG. 10. The difference between the infrared light emitting device 1000 and the infrared light emitting device 900 shown in FIG. 9 is that the infrared light emitting device 1000 further includes an optical layer 130 disposed on the wavelength converting layer 124 and the reflective wall 126. In some embodiments, the LED chip 102 may be electrically connected to the base 120 by a wire 104 passing through an opening (not shown) of the wavelength converting layer 124 and the optical layer 130. In some embodiments, the wire 104 may pass through an upper surface or a side surface of the optical layer 130.

Figure 11:
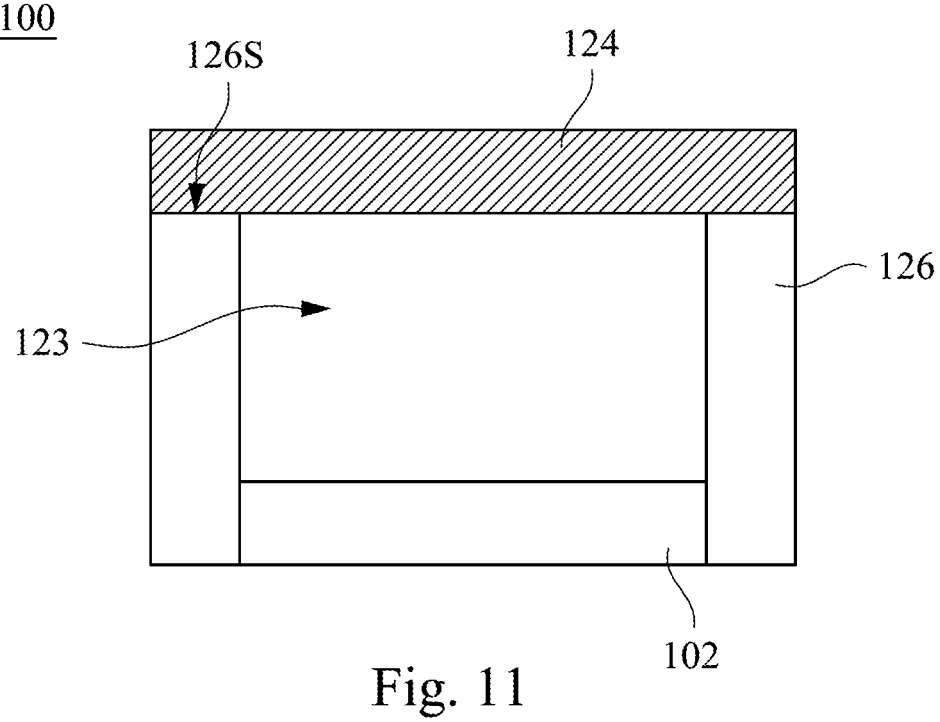

Please refer to FIG. 11. The infrared light emitting device 1100 includes a LED chip 102, a wavelength converting layer 124 and a reflective wall 126. The components in the infrared light emitting device 1100 may be the same as the components having same reference numbers in the above infrared light emitting device. In the following description, the relationship between the components will be described. As shown in FIG. 11, the reflective wall 126 surrounds the side wall of the LED chip 102 forming an accommodating space 123. A height of the reflective wall 126 may be greater than a height of the LED chip 102. The wavelength converting layer 124 is disposed on a top surface 126S of the reflective wall 126. The wavelength converting layer 124 and the LED chip 102 are separated from each other by the accommodating space 123 with a certain distance. Therefore, the wavelength converting layer 124 can have desired heat stability and chemical stability that would be affected by the LED chip 302. In addition, lifespan of the wavelength converting layer 124 can be prolonged, product reliability of the infrared light emitting device can be increased. This concept may be applied for other embodiments, and will not be repeated hereinafter.

Figure 12:
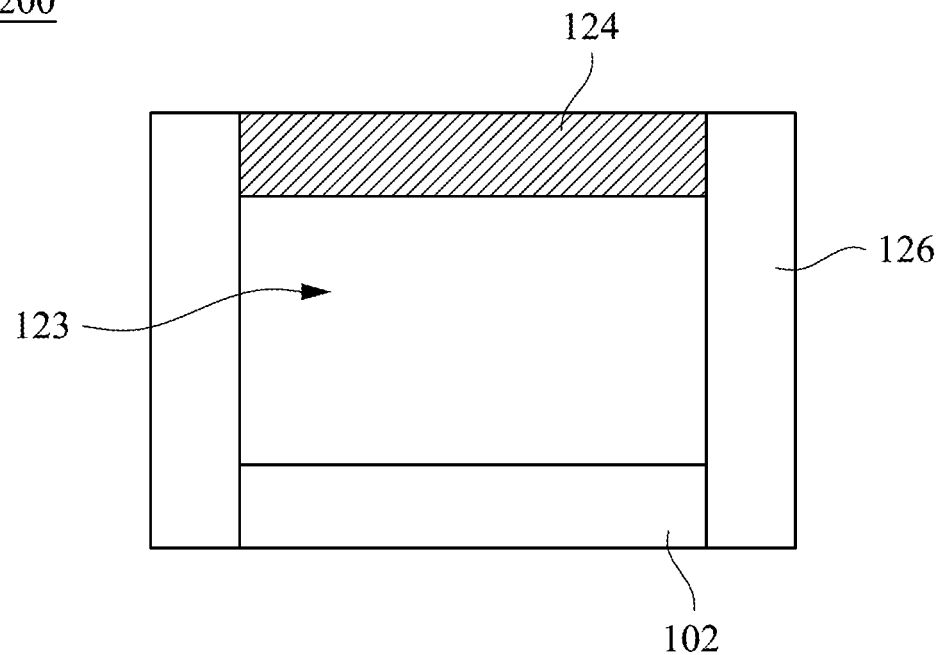

Please refer to FIG. 12. The difference between the infrared light emitting device 1200 and the infrared light emitting device 1100 shown in FIG. 11 is that the wavelength converting layer 124 of the infrared light emitting device 1200 is disposed between the inner side walls of the reflective wall 126.

Figure 13:
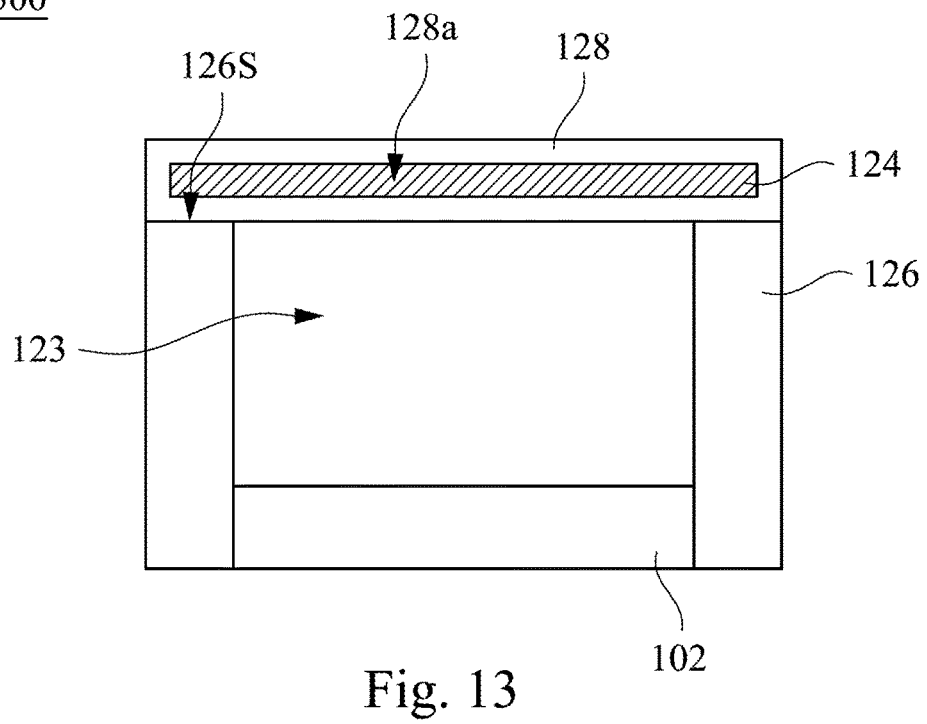

Please refer to FIG. 13. The difference between the infrared light emitting device 1300 and the infrared light emitting device 1100 shown in FIG. 11 is that the infrared light emitting device 1300 further includes structural element 128, and the wavelength converting layer 124 is disposed in an accommodating region 128a defined by the structural element 128. The structural element 128 can supports, packages or protects the wavelength converting layer 124. The structural element 128 wraps the wavelength converting layer 124, and is disposed on a top surface 126S of the reflective wall 126. The structural element 128 and the LED chip 102 are separated from each other by the accommodating space 123. The structural element 128 may be the same as the structural element 128 shown in infrared light emitting devices 400, 500, and will not be repeated hereafter. In one embodiment, the accommodating space 123 may be an empty space not filled with any material. In another embodiment, the accommodating space 123 may be filled with transparent material or light transmissive material to avoid blocking light emitting from the wavelength converting layer 124.

Figure 14:
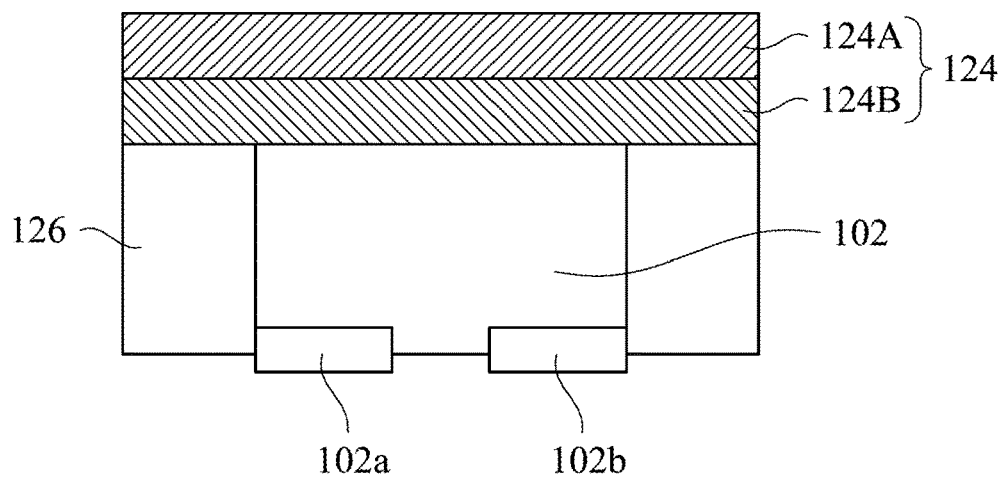

Reference is made to FIG. 14. The infrared light emitting device 1400 includes LED chip 102, reflective wall 126, and wavelength converting layer 124. As shown in FIG. 14, the reflective wall 126 is disposed on the side surface of the LED chip 102. In some embodiments, the LED chip 102 may be electrically connected to a base or a circuit board (not shown) with a first electrode 102a and a second electrode 102b by a flip-chip manner. In some embodiments, the LED chip 102 may be blue LED chip or the LED chip emitting other color light. The wavelength converting layer 124 is disposed on a top surface of the LED chip 102 (i.e. the light emitting surface). The wavelength converting layer 124 of the infrared light emitting device 1400 may include a first wavelength converting layer 124A and a second wavelength converting layer 124B having different characteristics from each other. The second wavelength converting layer 124B is disposed between the first wavelength converting layer 124A and the LED chip 102. In some embodiments, the first wavelength converting layer 124A include the infrared emitting fluoride phosphor described above, and the second wavelength converting layer 124B includes other wavelength converting material such as phosphor, quantum dot, or a combination thereof.

In some embodiments, the wavelength converting material in the second wavelength converting layer 124B is excited by a first light emitted from the LED chip 102 to emit a second light having a wavelength of 400-700 nm. The infrared emitting fluoride phosphor in the first wavelength converting layer 124A is then excited by the second light to emit a first infrared ray having a wavelength of 650-1000 nm. In other embodiments, the first wavelength converting layer 124A may further include other wavelength converting material, which is excited by the first light or the second light to emit a second infrared ray. In some examples, the first infrared ray has a first peak emission wavelength, the second infrared ray has a second peak emission wavelength, and the first peak emission wavelength is different from the second peak emission wavelength. The emission wavelength range of the infrared light emitting device 1400 may be broaden by adding at least one wavelength converting material emitting infrared ray such as nitride phosphor, oxide phosphor, fluoride phosphor, sulfide phosphor, silicate phosphor, quantum dots PbS, PbSe, or the like, to the first wavelength converting layer 124A having the infrared emitting fluoride phosphor of this invention.

Figure 15:
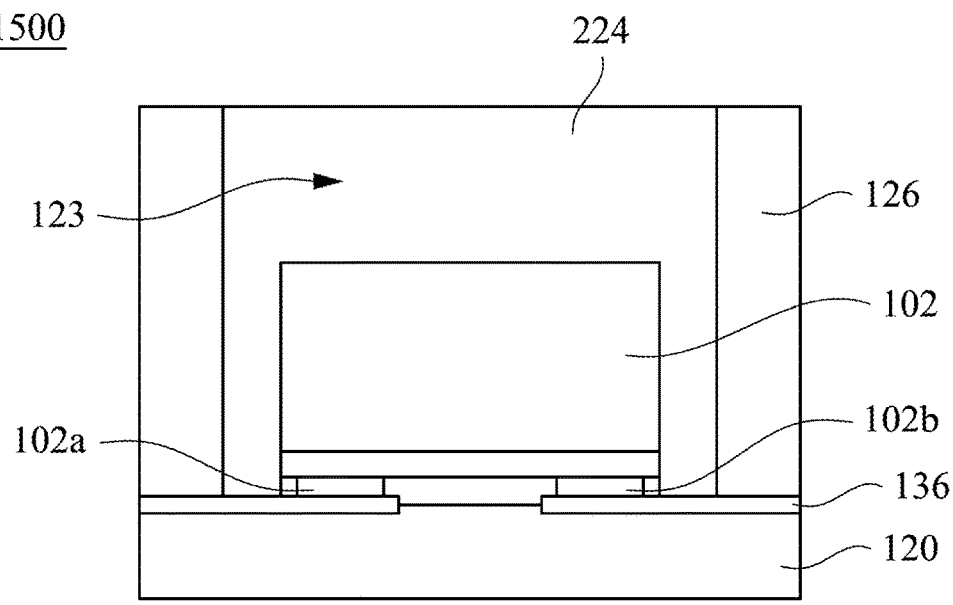

Reference is made to FIG. 15. The infrared light emitting device 1500 includes a base 120, a LED chip 102, a wavelength converting layer 224 and a reflective wall 126. The components in the infrared light emitting device 1500 may be the same as the components having same reference numbers of the aforementioned infrared light emitting device. In the following description, the relationship between the components will be described. The reflective wall 126 is disposed on the base 120 and defines an accommodating space 123. In some embodiments, the wavelength converting layer 224 includes aforementioned infrared emitting fluoride phosphor. In other embodiments, the wavelength converting layer 224 further includes other wavelength converting material such as phosphor, quantum dot, or a combination thereof. The LED chip 102 is disposed in the accommodating space 123, and electrically connected to a conductive element 136 on the base 120 with a flip-chip manner. The wavelength converting layer 224 is filled in the accommodating space 123, and in contact with the LED chip 102.

Figure 16:
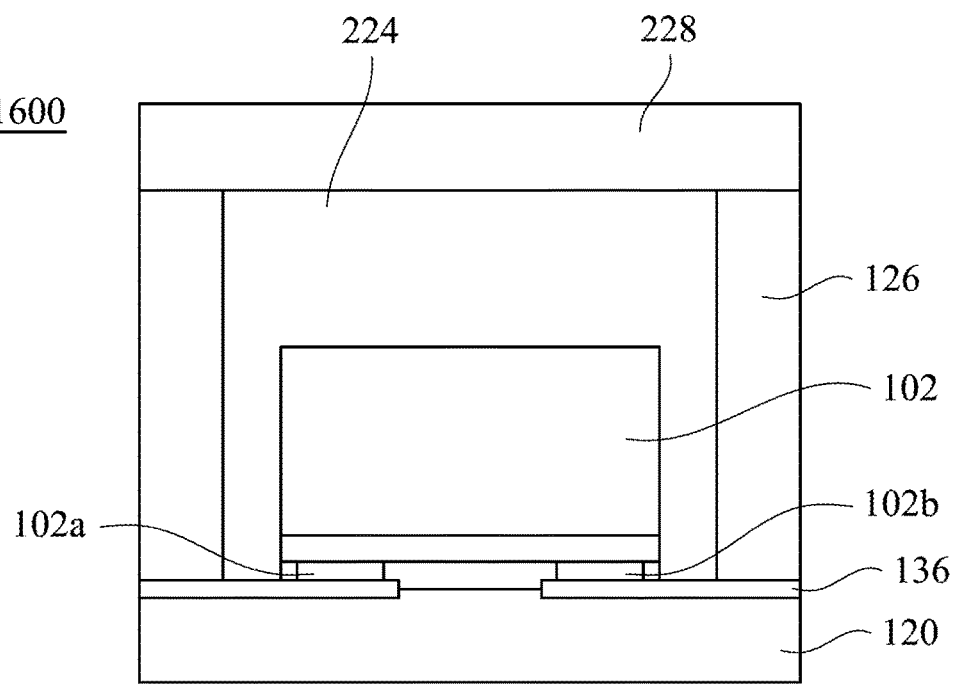

Reference is made to FIG. 16. The difference between the infrared light emitting device 1600 and the infrared light emitting device 1500 shown in FIG. 15 is that the infrared light emitting device 1600 further includes an structural element 228 disposed on the wavelength converting layer 224 and the reflective wall 126. The structural element 228 can package and protect the wavelength converting layer 224 from a foreign substance such as moisture, oxygen gas that would cause damage. In some embodiments, the structural element 228 may be the same as the structural element 288 of the infrared light emitting device 600, and will not be repeated hereafter.

Figure 17:
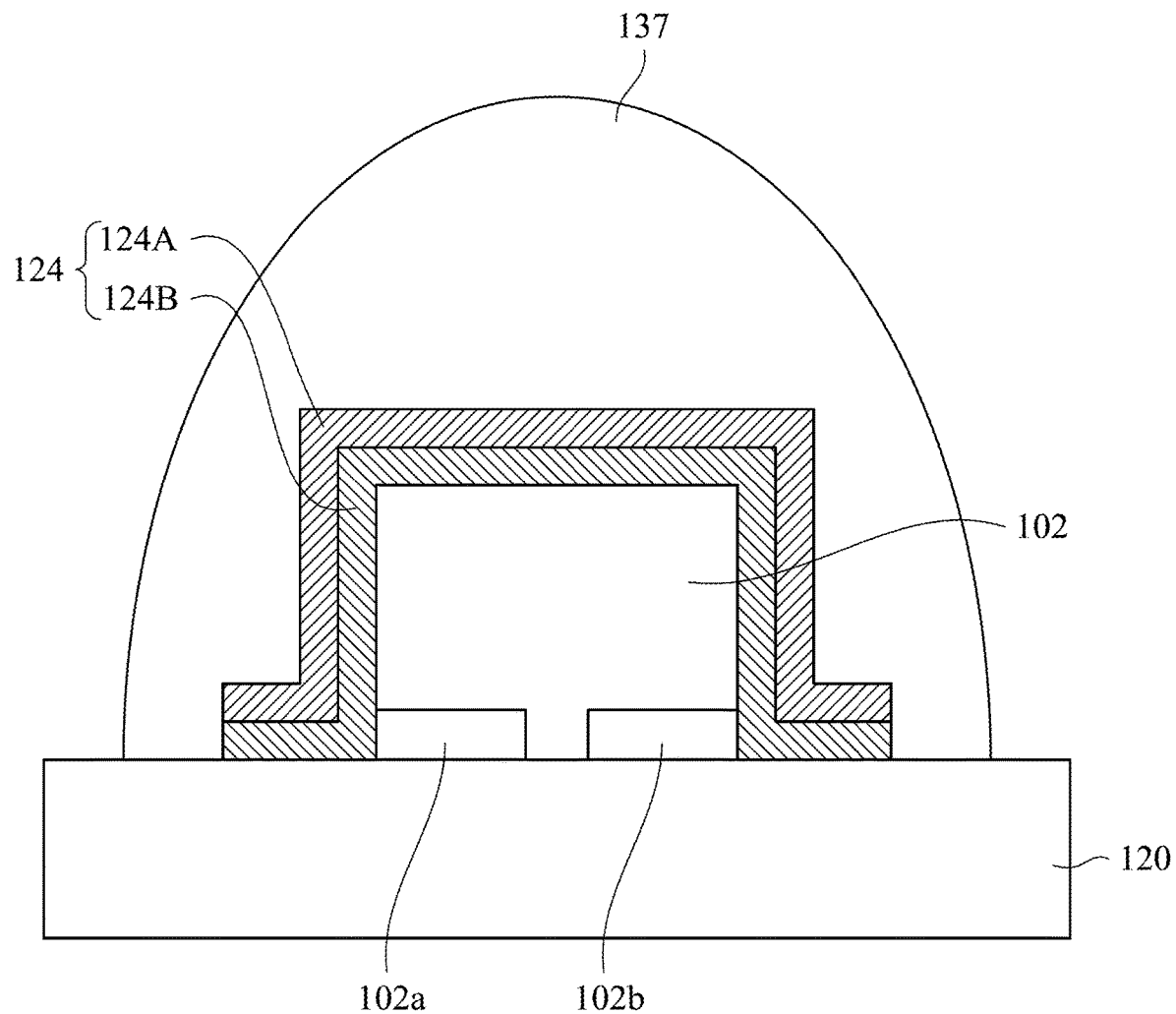

Reference is made to FIG. 17. The infrared light emitting device 1700 includes a base 120, a LED chip 102, a wavelength converting layer 124 and a transparent gel 137. In some embodiments, the components in the infrared light emitting device 1700 may be the same as the components having same reference numbers of the infrared light emitting device 1400. In the following description, the relationship between the components will be described. The LED chip 102 is electrically connected to the base 120 by a flip-chip manner. The wavelength converting layer 124 is disposed on a top surface and a side surface of the LED chip 102, and may be extended onto the top surface of the base 120. The wavelength converting layer 124 includes a first wavelength converting layer 124A and a second wavelength converting layer 124B disposed between the first wavelength converting layer 124A and the LED chip 102. In some embodiments, the first wavelength converting layer 124A includes the aforementioned infrared emitting fluoride phosphor, and the second wavelength converting layer 124B includes phosphor, quantum dot, or a combination thereof. The transparent gel 137 may be used as packaging material to cover the wavelength converting layer 124 and the base 120.

As described above, according to the embodiments of the present invention, a novel infrared emitting fluoride phosphor and an infrared light emitting device including thereof are provided. The infrared emitting fluoride phosphor of this invention includes an activation center of $Cr^{3+}$. The preparation method of the infrared emitting fluoride phosphor is simple and can be synthesized at room temperature. The infrared emitting fluoride phosphor of this invention has broad emission wavelength. The infrared light emitting device including this infrared emitting fluoride phosphor can replace the conventional infrared light emitting devices, and can be applied to various fields, such as food inspection device, cancer detection device, etc. In addition, the infrared light emitting device of the present invention can also be used with other infrared emitting phosphors and/or LEDs. For example, the infrared light emitting device can be used with other infrared emitting phosphor to broaden the emission wavelength, or be used with green LED to monitor heartbeat.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. An infrared emitting fluoride phosphor, comprising an activation center of $Cr^{3+}$, wherein the infrared emitting fluoride phosphor is at least one selected from the group consisting of (A) and (B):
   (A) $A_3B_{1-x}F_6$:$xCr^{3+}$, wherein A comprises Li, Na, K, Rb, Cs, $NH_4$, or a combination of thereof, B comprises Al, Ga, or a combination of thereof, and $0<x\leq1$, and
   (B) $A_3B_{1-y-z}F_6$:$yCr^{3+}$, $zNi^{2+}$, wherein A comprises Li, Na, K, Rb, Cs, $NH_4$, or a combination of thereof, B comprises Al, Ga, or a combination of thereof, $0<y<1$, $0<z<1$, and $0<y+z\leq1$.

2. The infrared emitting fluoride phosphor of claim 1, wherein the infrared emitting fluoride phosphor is excited by a light source of a wavelength of 400-700 nm to emit an infrared ray, and the infrared ray has an emission wavelength of 650-1000 nm.

3. The infrared emitting fluoride phosphor of claim 2, wherein the infrared ray has a spectrum having a peak emission wavelength of 735-750 nm.

4. The infrared emitting fluoride phosphor of claim 3, wherein the spectrum has a full width at half maximum (FWHM) of 90-110 nm.

5. An infrared light emitting device, comprising:
   a light source configured to emit a first light, wherein the first light has a wavelength of 400-700 nm; and
   an infrared emitting fluoride phosphor comprising an activation center of $Cr^{3+}$, wherein the infrared emitting fluoride phosphor is capable of being excited by the first light to emit a first infrared ray, and the first infrared ray has an emission wavelength of 650-1000 nm, wherein the infrared emitting fluoride phosphor is at least one selected from the group consisting of (A) and (B):
   (A) $A_3B_{1-x}F_6$:$xCr^{3+}$, wherein A comprises Li, Na, K, Rb, Cs, $NH_4$, or a combination of thereof, B comprises Al, Ga, or a combination of thereof, and $0<x\leq1$; and
   (B) $A_3B_{1-y-z}F_6$:$yCr^{3+}$, $zNi^{2+}$, wherein A comprises Li, Na, K, Rb, Cs, $NH_4$, or a combination of thereof, B comprises Al, Ga, or a combination of thereof, $0<y<1$, $0<z<1$, and $0<y+z\leq1$.

6. The infrared light emitting device of claim 5, wherein the infrared emitting fluoride phosphor is dispersed in a packaging material, and the packaging material surrounds the light source.

7. The infrared light emitting device of claim 5, further comprising a first wavelength converting layer in contact with a surface of the light source or disposed over the light source, wherein the first wavelength converting layer comprises the infrared emitting fluoride phosphor.

8. The infrared light emitting device of claim 5, further comprising a phosphor, a quantum dot, or a combination of thereof, the phosphor, the quantum dot, or the combination of thereof configured to be excited by the first light to emit a second light, wherein the second light comprises a second infrared ray and/or a visible light,
   wherein the first infrared ray has a first peak emission wavelength, the second infrared ray has a second peak emission wavelength, and the first peak emission wavelength is different from the second peak emission wavelength,
   wherein the visible light has a wavelength of 400-700 nm, and the infrared emitting fluoride phosphor is configured to be excited by the visible light to emit a third infrared ray, wherein the third infrared ray has an emission wavelength of 650-1000 nm.

9. The infrared light emitting device of claim 8, wherein the infrared emitting fluoride phosphor is blended with the phosphor, the quantum dot, or the combination of thereof in a packaging material, and the packaging material surrounds the light source.

10. The infrared light emitting device of claim 8, further comprising a first wavelength converting layer in contact with a surface of the light source or disposed over the light source, wherein the first wavelength converting layer comprising:
   the infrared emitting fluoride phosphor; and
   the phosphor, the quantum dot, or the combination of thereof.

11. The infrared light emitting device of claim 8, further comprising a first wavelength converting layer and a second wavelength converting layer, wherein the second wavelength converting layer is disposed between the first wavelength converting layer and the light source, the first wavelength converting layer comprises the infrared emitting fluoride phosphor, and the second wavelength converting layer comprises the phosphor, the quantum dot, or the combination of thereof.

12. The infrared light emitting device of claim 5, wherein the first infrared ray has a spectrum having a peak emission wavelength of 735-750 nm.

13. The infrared light emitting device of claim 12, wherein the spectrum has a full width at half maximum (FWHM) of 90-110 nm.

14. The infrared light emitting device of claim 5, wherein the light source comprises a LED chip.

15. An infrared light emitting device, comprising:
   a light source configured to emit a first light;
   a first wavelength converting material configured to be excited by the first light to emit a second light, wherein the second light has a wavelength of 400-700 nm; and
   an infrared emitting fluoride phosphor comprising an activation center of $Cr^{3+}$, wherein the infrared emitting fluoride phosphor is configured to be excited by the second light to emit a first infrared ray, and the first infrared ray has an emission wavelength of 650-1000 nm, wherein the infrared emitting fluoride phosphor is at least one selected from the group consisting of (A) and (B):
   (A) $A_3B_{1-x}F_6$:$xCr^{3+}$, wherein A comprises Li, Na, K, Rb, Cs, $NH_4$, or a combination of thereof, B comprises Al, Ga, or a combination of thereof, and $0<x\leq1$; and
   (B) $A_3B_{1-y-z}F_6$:$yCr^{3+}$, $zNi^{2+}$, wherein A comprises Li, Na, K, Rb, Cs, $NH_4$, or a combination of thereof, B comprises Al, Ga, or a combination of thereof, $0<y<1$, $0<z<1$, and $0<y+z\leq1$.

16. The infrared light emitting device of claim 15, further comprising a second wavelength converting material, which is configured to be excited by the first light or the second light to emit a second infrared ray, wherein the first infrared ray has a first peak emission wavelength, the second infrared ray has a second peak emission wavelength, and the first peak emission wavelength is different from the second peak emission wavelength.

17. The infrared light emitting device of claim 15, wherein the first wavelength converting material comprises a phosphor, a quantum dot, or a combination of thereof.

18. The infrared light emitting device of claim 15, wherein the light source comprises a LED chip.

* * * * *